United States Patent
Kamimura

(10) Patent No.: US 7,143,229 B2
(45) Date of Patent: Nov. 28, 2006

(54) SINGLE-CHIP MICROCOMPUTER WITH DYNAMIC BURN-IN TEST FUNCTION AND DYNAMIC BURN-IN TESTING METHOD THEREFOR

(75) Inventor: Ryohei Kamimura, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 501 days.

(21) Appl. No.: 10/128,962

(22) Filed: Apr. 24, 2002

(65) Prior Publication Data
US 2002/0161963 A1 Oct. 31, 2002

(30) Foreign Application Priority Data
Apr. 25, 2001 (JP) .............................. 2001-127653

(51) Int. Cl.
*G06F 12/00* (2006.01)
(52) U.S. Cl. ....................... 711/103; 711/154; 711/200; 257/48
(58) Field of Classification Search ................ 711/103, 711/154, 200; 714/48, 718; 365/185.22, 365/185.29, 185.33, 207; 713/166; 712/36, 712/37
See application file for complete search history.

(56) References Cited

U.S. PATENT DOCUMENTS

| | | | |
|---|---|---|---|
| 5,396,639 A * | 3/1995 | Suenaga et al. ............... 712/37 |
| 5,511,211 A * | 4/1996 | Akao et al. ..................... 712/36 |
| 5,721,834 A * | 2/1998 | Milhaupt et al. ........... 710/100 |
| 6,151,693 A * | 11/2000 | Arnold et al. ............... 714/718 |
| 6,198,663 B1 * | 3/2001 | Takizawa ................ 365/185.29 |
| 6,243,313 B1 * | 6/2001 | Sakamoto et al. .......... 365/207 |
| 6,457,126 B1 * | 9/2002 | Nakamura et al. .......... 713/166 |
| 6,683,810 B1 * | 1/2004 | Sakamoto .............. 365/185.22 |

FOREIGN PATENT DOCUMENTS

EP 0642083 A1 * 8/1995

\* cited by examiner

*Primary Examiner*—Mano Padmanabhan
*Assistant Examiner*—Kaushik Patel
(74) *Attorney, Agent, or Firm*—Scully, Scott, Murphy & Presser, P.C.

(57) ABSTRACT

In a single-chip microcomputer including a nonvolatile semiconductor memory device and write, read and erase circuits for performing a write operation, a read operation and an erase operation upon the nonvolatile semiconductor memory device, respectively, a sequencer is connected between the write, read and erase circuits and an interface. The sequencer receives first data via the interface from the exterior to write the first data into the nonvolatile semiconductor memory device, reads the first data from the nonvolatile semiconductor device, compares the first data with second data read via the interface from the exterior thus performing a verification upon the nonvolatile semiconductor memory device, and reads third data from the nonvolatile semiconductor memory device and transmits the third data via the interface to the exterior.

17 Claims, 13 Drawing Sheets

SINGLE-CHIP MICROCOMPUTER WITH DYNAMIC BURN-IN TEST FUNCTION AND DYNAMIC BURN-IN TESTING METHOD THEREFOR

BACKGROUND OF THE INVENTION

1. Field of the Invention

The present invention relates to a single-chip microcomputer including a nonvolatile semiconductor memory device with a dynamic burn-in test function and its dynamic burn-in testing method.

2. Description of the Related Art

Generally, in order to reveal defective single-chip microcomputers resulting from time and stress due to inherent defects or manufacturing fluctuations, a burn-in test screening method is carried out at a stage of testing before shipment. As typical burn-in test screening methods, there are a static burn-in test screening method, a clocked burn-in test screening method and a dynamic burn-in test screening method.

In a static burn-in test screening method for a single-chip microcomputer in a high temperature state, all input/output terminals are made to be at special levels, and power supply voltages are supplied to power supply terminals. In the static burn-in test screening method, since the single-chip microcomputer is not operated, stress is not equally applied to the elements of the single-chip microcomputer, so that only a small burn-in test screening effect is obtained.

In a clocked burn-in test screening method for a single-chip microcomputer in a high temperature state, only clock signals required for operating the single-chip microcomputer are supplied thereto, so that the single-chip microcomputer carries out special operations. Also, in the clocked burn-in test screening method, since the operation of the single-chip microcomputer is limited, stress is not equally applied to the elements of the single-chip microcomputer, so that only a small burn-in test screening effect is obtained.

In a dynamic burn-in test screening method for a single-chip microcomputer in a high temperature state, various kinds of voltages are supplied to input terminals while usual power supply voltages or higher power supply voltages are supplied as power supply voltages. As a result, the single-chip microcomputer is operated, so that data are generated at output terminals and are compared with expected data. Thus, in the dynamic burn-in test screening method, since the single-chip microcomputer is actually operated, stress is equally applied to the elements of the single-chip microcomputer, so that the burn-in test screening effect can be enhanced.

In a prior art dynamic burn-in test system for a single-chip microcomputer incorporating a nonvolatile semiconductor memory such as a flash electrically-erasable programmable read-only memory(EEPROM), the single-chip microcomputer is also constructed by a write circuit for writing data into the flash EEPROM, a read circuit for reading data from the flash EEPROM, and an erase circuit for performing a flash erase operation upon the flash EEPROM.

In the above-described prior art dynamic burn-in test system, when carrying out a dynamic burn-in test, a large scale integrated (LSI) tester directly controls the write circuit, the read circuit and the erase circuit, so as to perform a write operation, a read operation and a flash erase operation upon the flash EEPROM, respectively. Then, when the read circuit receives a read instruction from the LSI tester, one word of data is read from the flash EEPROM to the LSI tester, so that the LSI tester compares the read word of data with expected data, thus carrying out a verification, i.e., determining whether the flash EEPROM, the write circuit, the read circuit and the flash erase circuit are normal. Also, in order to enhance the burn-in test screening effect without increasing the number of signals supplied to the single-chip microcomputer, test programs are stored in the flash EEPROM in advance, so that all the internal circuits in the single-chip microcomputer are operated, i.e., stress is applied to all the internal circuits as equally as possible. This will be explained later in detail.

In the above-described prior art burn-in test system, however, the flash EEPROM is required to be large in size, and the burn-in screening effect deteriorates. Further, the LSI tester is high in manufacturing cost. This also will be explained later in detail.

SUMMARY OF THE INVENTION

It is an object of the present invention to provide a single-chip microcomputer including a nonvolatile semiconductor memory device and its dynamic burn-in test method capable of decreasing the size of the nonvolatile semiconductor memory and enhancing the burn-in screening effect with a simple tester.

According to the present invention, in a single-chip microcomputer including a nonvolatile semiconductor memory device and write, read and erase circuits for performing a write operation, a read operation and an erase operation upon the nonvolatile semiconductor memory device, respectively, a sequencer is connected between the write, read and erase circuits and an interface. The sequencer receives first data via the interface from the exterior to write the first data into the nonvolatile semiconductor memory device, read the first data from the nonvolatile semiconductor memory device, compares the first data with second data read via the interface from the exterior thus performing a verification upon the nonvolatile semiconductor memory device, and reads third data from the nonvolatile semiconductor memory device and transmits the third data via the interface to the exterior.

Also, in a dynamic burn-in test method for two single-chip microcomputers each including a nonvolatile semiconductor memory device, a test program is written into the nonvolatile semiconductor memory devices of the single-chip microcomputers to operate the single-chip microcomputers using the test program. Then, a flash erase operation is performed upon the nonvolatile semiconductor memory device of one of the single-chip microcomputers. Then, a first content of the nonvolatile semiconductor memory device of the other of the single-chip microcomputers is moved to the nonvolatile semiconductor memory device of the one of the single-chip microcomputers. Then, the first content of the nonvolatile semiconductor memory device of the one of the single-chip microcomputers is compared with a second content of the nonvolatile semiconductor memory device of the other of the single-chip microcomputers, thus carrying out a verification of the nonvolatile semiconductor memory device of the one of the single-chip microcomputers.

Further, in a dynamic burn-in test method for at least first, second and third single-chip microcomputers connected in a ring shape, each including a nonvolatile semiconductor memory device, a test program is written into the nonvolatile semiconductor memory devices of the first, second and third single-chip microcomputers to operate the first, second and third single-chip microcomputers using the test program. Then, a flash erase operation is performed upon the nonvolatile semiconductor memory device of the first single-chip microcomputers. Then, the first single-chip microcomputer is operated to receive data from the third single-chip microcomputer, compare the data from the third single-chip microcomputer with data of the nonvolatile semiconductor memory device of the single-chip microcomputer, and transmit "0" data to the second single-chip microcomputer. Also, the second single-chip microcomputer is operated to receive the data from the first single-chip microcomputer, perform an OR logic operation upon the data from the first single-chip microcomputer and data of the nonvolatile semiconductor memory device of the second signal-chip microcomputer, and transmit result data of the OR logic operation to the third single-chip microcomputer. Further, the third single-chip microcomputer is operated to receive the data from the second single-chip microcomputer, perform an OR logic operation upon the data from the second single-chip microcomputer and data of the nonvolatile semiconductor memory device of the third signal-chip microcomputer, transmit result data of the OR logic operation to the first single-chip microcomputer when the data from the second single-chip microcomputer coincides with the data of the nonvolatile semiconductor memory device of the third single-chip microcomputer, and transmit the data from the second single-chip microcomputer to the first single-chip microcomputer when the data from the second single-chip the second single-chip microcomputer does not coincide with the data of the nonvolatile semiconductor memory device of the third single-chip microcomputer.

BRIEF DESCRIPTION OF THE DRAWINGS

The present invention will be more clearly understood from the description set forth below, as compared with the prior art, with reference to be accompanying drawings, wherein.

DESCRIPTION OF THE PREFERRED EMBODIMENT

Before the description of the preferred embodiments, a prior art dynamic burn-in test system for a single-chip microcomputer will be now explained with reference to FIG. 1.

Figure 1:
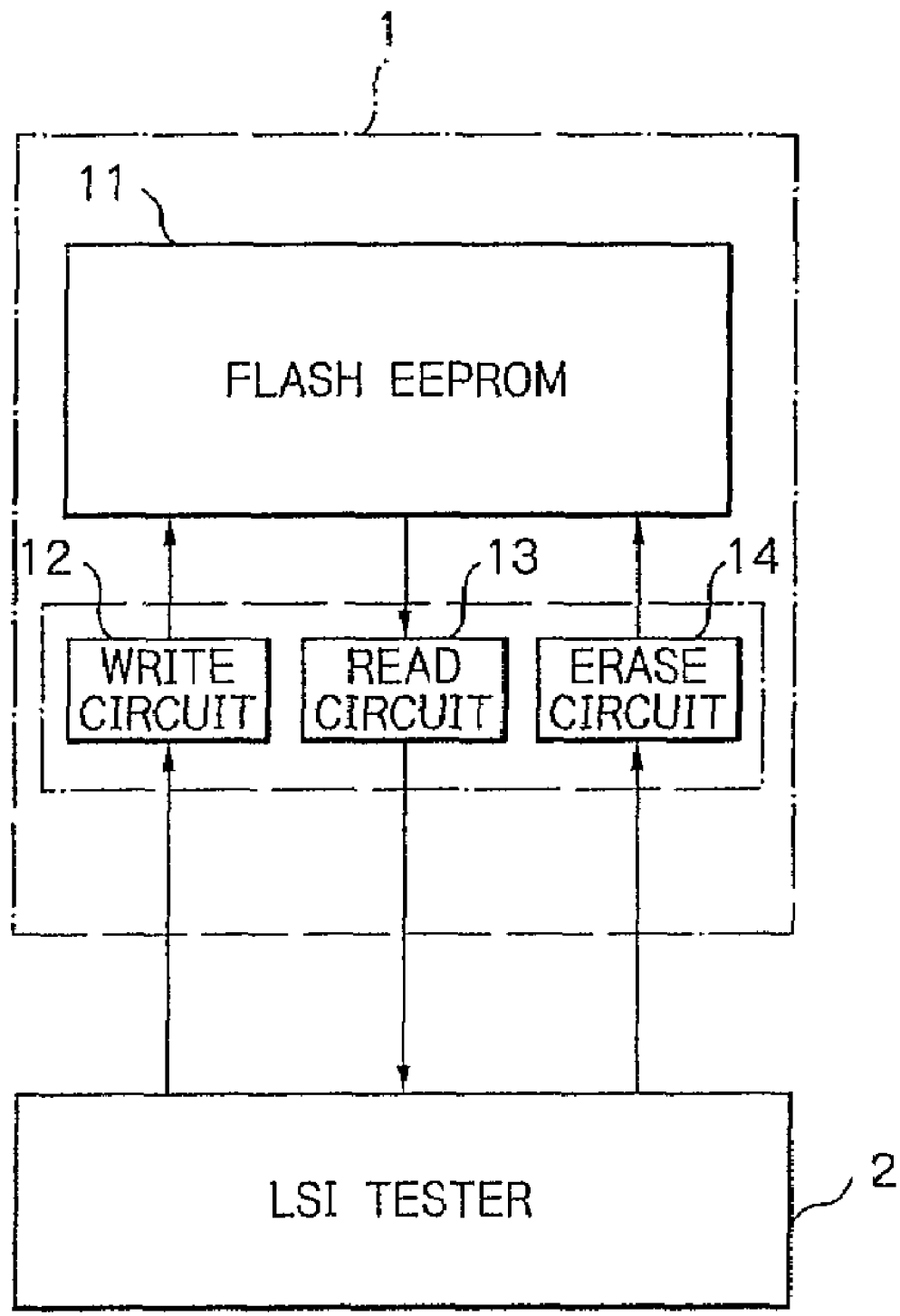
FIG. 1 is a block circuit diagram illustrating a prior art dynamic burn-in test system for a single-chip microcomputer.

In FIG. 1, a single-chip microcomputer 1 is under a dynamic burn-in test by as LSI tester 2. That is, the single-chip microcomputer 1 is mounted on a test board (not shown) in a high temperature state bath. Note that a large number of single-chip microcomputers are connected to the LSI tester 2; however, only one single-chip microcomputer is illustrated for simplifying the description.

The single-chip microcomputer 1 is constructed by a flash EEPROM 11, a write circuit 12 for writing data into the flash EEPROM 11, a read circuit 13 for reading data from the flash EEPROM 11, and an erase circuit 14 for performing a flash erase operation upon the flash EEPROM 11. Note that the single microcomputer 1 includes other circuits such as a central processing unit (CPU) and a logic circuit (not shown).

In the dynamic burn-in test, the LSI tester 2 directly controls the write circuit 12, the read circuit 13 and the erase circuit 14, so as to perform a write operation, a read operation and a flash erase operation upon the flash EEPROM 11, respectively. Then, when the read circuit 13 receives a read instruction from the LSI tester 2, one word of data is read from the flash EEPROM 11 to the LSI tester 2, so that the LSI tester 2 compares the read word of data with expected data, thus carrying out a verification, i.e., determining whether the flash EEPROM 11, the write circuit 12, the read circuit 13 and the flash erase circuit 14 are normal.

In FIG. 1, in order to enhance the burn-in test screening effect without increasing the number of signals supplied to the single-chip microcomputer 1, a test program is stored in the flash EEPROM 11 in advance, so that all the internal circuits in the single-chip microcomputer 1 are operated, i.e., stress is applied to all the internal circuits as equally as possible.

In the above-described dynamic burn-in test system of FIG. 1, however, in order to completely operate the internal circuits in the single-chip microcomputer 1, a large test program stored in the flash EEPROM 1011 is required to increase the size thereof. Also, in the dynamic burn-in test, the rewrite operation of the flash EEPROM 11 is inhibited. Therefore, since it is difficult to completely operate the flash EEPROM 11, the burn-in screening effect deteriorates.

Also, in the dynamic burn-in test, since the LSI tester 2 directly controls the write circuit 12, the read circuit 1013 and the flash erase circuit 14 to perform a comparing operation upon the output data of the flash EEPROM 11, the LSI tester 2 is very complicated which increases the burn-in testing cost.

Figure 2:
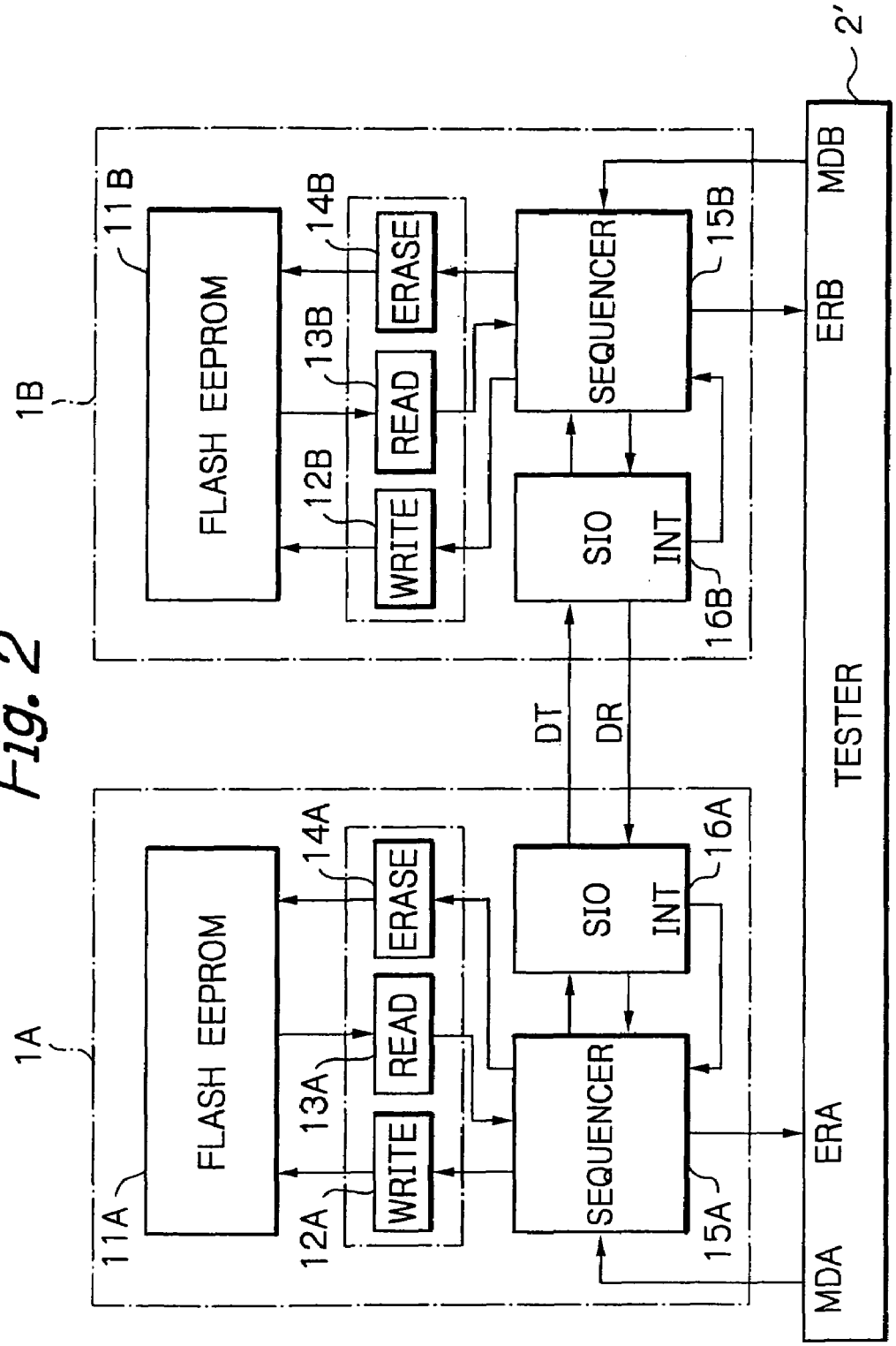
FIG. 2 is a block circuit diagram illustrating a first embodiment of the dynamic burn-in test system according to the present invention.

In FIG. 2, which illustrates a first embodiment of the dynamic burn-in test system according to the present invention, two single-chip microcomputers 1A and 1B having the same configuration are under a dynamic burn-in test by a tester 2'.

The single-chip microcomputers 1A includes a sequencer 15A and a serial interface 16A in addition to a flash EEPROM 11A, a write circuit 12A, a read circuit 13A and an erase circuit 14A corresponding to the flash EEPROM 11, the write circuit 12, the read circuit 13 and the erase circuit 14, respectively, of FIG. 1. Similarly, the single-chip microcomputers 1B includes a sequencer 15B and a serial interface 16B in addition to a flash EEPROM 11B, a write circuit 12B, a read circuit 13B and an erase circuit 14B corresponding to the flash EEPROM 11, the write circuit 12, the read circuit 13 and the erase circuit 14, respectively, of FIG. 1. That is, the tester 2' controls the write circuits 12A and 12B, the read circuits 13A and 13B and the erase circuit 14A and 14B through the sequencers 15A and 15B. Therefore, the burden of the tester 2' is smaller than that of the LSI tester 2 of FIG. 1, and also the tester 2' can be simplified.

Note that the single-chip microcomputer 1A (1B) includes other circuits such as a CPU and a logic circuit (not shown).

The serial interface 16A is connected to the serial interface 16B, so that the single-chip microcomputer 1A is connected to the single-chip microcomputer 1B. For example, in the single-chip microcomputer 1A, data DT is transmitted to the single-chip microcomputer 1B, while data DR from the single-chip microcomputer 1B is received. When the serial interface 16A or 16B receives data, the interface 16A or 16B generates an interrupt signal INT and transmits it to the sequencer 15A or 15B. Note that, although an input port and an output port are provided independently in each of the serial interfaces 16A and 16B, a single port can be provided therein. Also, a parallel interface can be provided instead of each of the serial interfaces 16A and 16B.

Figure 3:
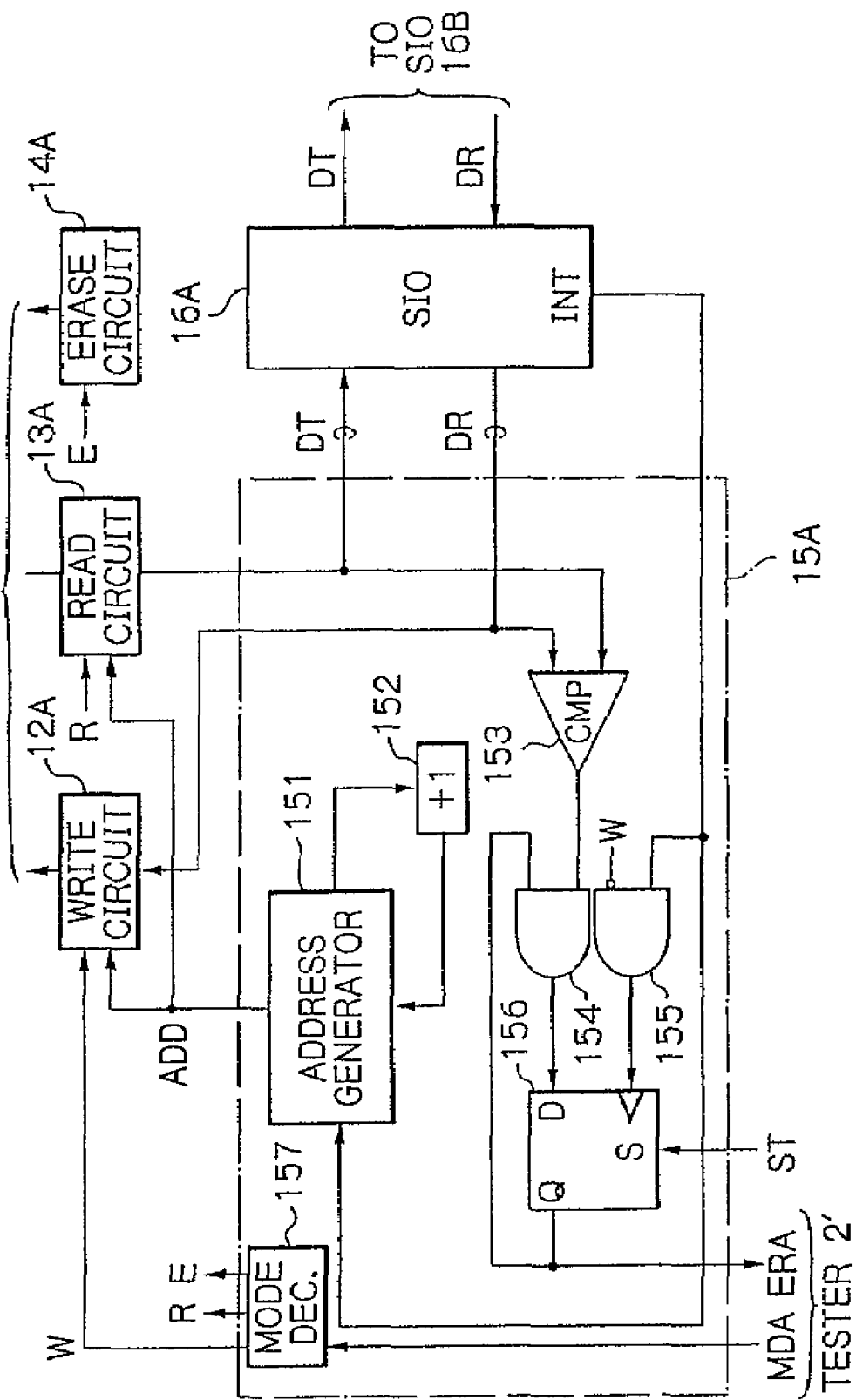
FIG. 3 is a detailed block circuit diagram of the sequencer of FIG. 2.

In FIG. 3, which is a detailed block circuit diagram of the sequencer 15A of the single-chip microcomputer 1A of FIG. 2, the sequencer 15A is constructed by an address generator 151 for generating an address signal ADD, an adder 152 for incrementing the content of the address signal ADD by +1, a comparator 153 for comparing data from the flash EEPROM 11A with data DR from the single-chip microcomputer 1B, AND circuits 154 and 155, a flip-flop 156 for generating an error signal ERA, and a mode decoder 157 for receiving a mode signal MDA to generate a write signal W, a read signal R and an erase signal E, thus operating the write circuit 12A, the read circuit 13A and the erase circuit 14A.

When the interrupt signal INT is supplied via the AND circuit 155 to a clock terminal of the flip-flop 156, the flop-fop 156 fetches data at its data input, i.e., the output signal of the comparator 153 through the AND circuit 154.

Also, after the output Q of the flip-flop 156 is made "0" (low level), i.e., after the error signal ERA is made "0" (error state), the AND circuit 154 stops the transmission of the output signal of the comparator 153, so that the output Q of the flip-flop 156 is kept "0" (error state). Note that the flip-flop 156 is initialized by supplying a set signal ST thereto before the burn-in test. Therefore, the tester 2' monitors the error signal ERA to determine whether or not the signal-chip microcomputer 1B is normal.

Further, when the mode decoder 157 generates a write signal W, the AND circuit 155 stops the transmission of the interrupt signal INT to the flip-flop 156, thus stopping a verification operation.

Note that the sequencer 15B of the signal-chip microcomputer 1B has the same configuration as illustrated in FIG. 3.

The operation of the dynamic burn-in test system of FIG. 2 will be explained next with reference to FIGS. 4, 5 and 6.

First, at step 401, the single-chip microcomputers 1A and 1B are initialized. That is, a flash erase operation is performed upon each of the flash EEPROMs 11A and 11B by the erase circuits 14A and 14B. Then, the same test program is stored in the EEPROMs 11A and 11B.

Next, at step 402, the single-chip microcomputers 1A and 1B are mounted on a test board in a high temperature state bath. Note that the test board is electrically connected to the tester 2'. Also, the flip-flop 136 of each of the sequencers 15A and 15B is initialized by supplying a set signal ST thereto.

Next, at step 403, a verification is performed upon the flash EEPROM 11A of the single-chip microcomputer 1A. This will be explained later.

Next, at step 404, a verification is performed upon the flash EEPROM 11B of the single-chip microcomputer 1B. This also will be explained later.

Figure 4:
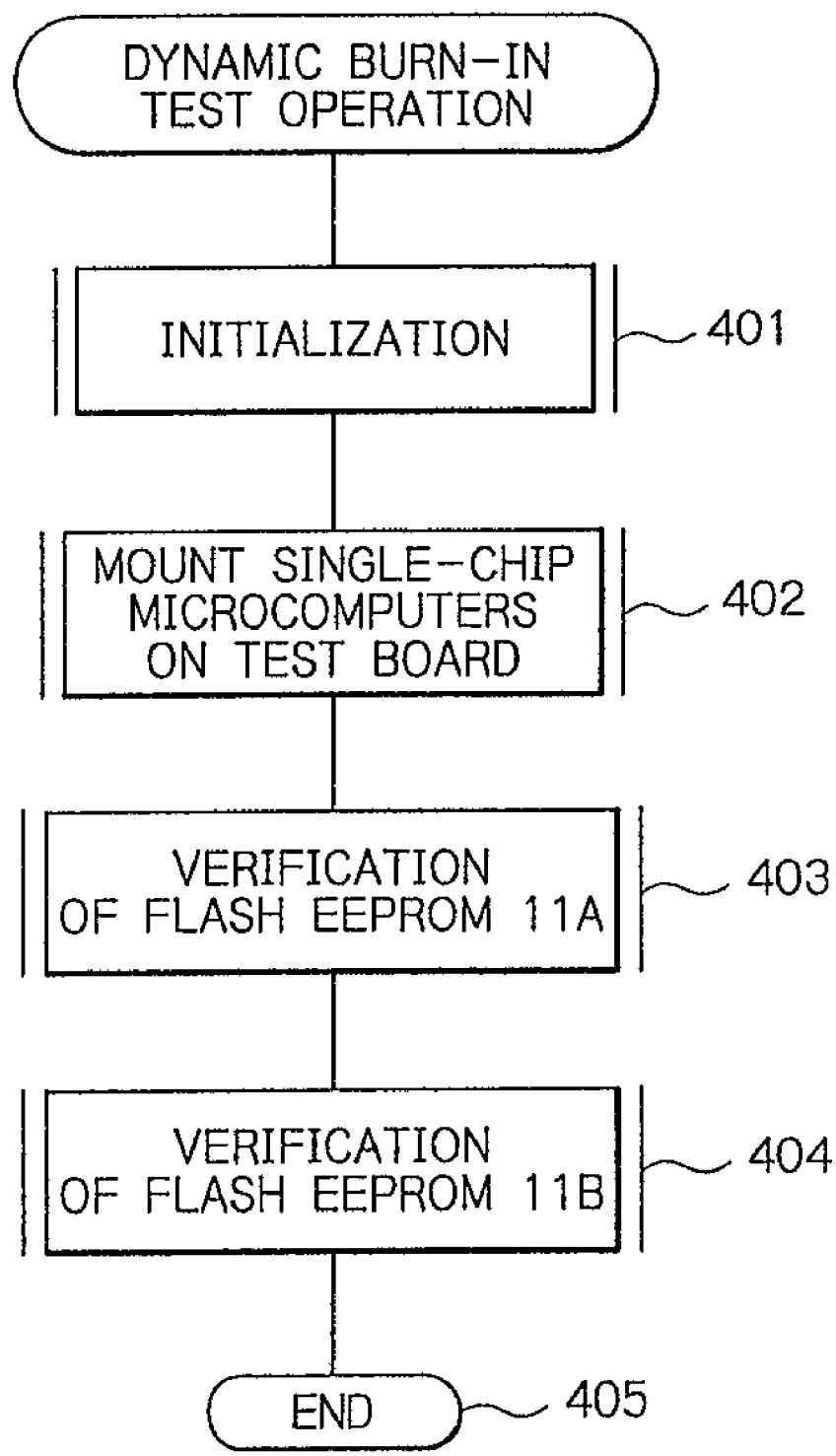
FIG. 4 is a flowchart for explaining the operation of the dynamic burn-in test system of FIG. 2.

Thus, the flowchart of FIG. 4 is completed by step 405.

Step 403 of FIG. 4 will be explained next with reference to FIG. 5.

First, at step 501, the single-chip microcomputer 1A is operated in accordance with the test program stored in the flash EEPROM 11A, thus activating the logic circuit (not shown) of the single-chip microcomputer 1A. This operation is carried out by supplying a special signal to the single-chip microcomputer 1A or the like.

Next, at step 502, the tester 2' causes the mode signal MDA to be "flash erase mode". As a result, the mode decoder 157 of the sequencer 15A operates the erase circuit 14A, so that a flash erase operation is performed upon the flash EEPROM 11A. That is, "0" is written into all the cells of the flash EEPROM 11A.

Next, at step 503, the tester 2' causes the mode signal MDB to be "read mode", and simultaneously, causes the mode signal MDA to be "write mode". As a result, the mode decoder 157 of the sequencer 15B operates the read circuit 13B, and the mode decoder 157 of the sequencer 15A operates the write circuit 12A. As a result, the content of the flash EEPROM 11B is moved via the serial interfaces 16B and 16A to the flash EEPROM 11A. In this case, upon receipt of one word data from the serial interface 16B, the serial interface 16A generates an interrupt signal INT to increment the address ADD of the address generator 151 of the sequencer 16A. Therefore, each word data of the flash EEPROM 11B having an address is written into the same address of the flash EEPROM 11A. Note that the flip-flop 156 of the sequencer 15A is not operated due to the presence of the write signal W.

Next, at step 504, the tester 2' causes the mode signal MDB to be "read mode", and simultaneously, causes the mode signal MDA to be "read mode". As a result, the mode decoder 157 of the sequencer 15B operates the read circuit 13B, and the mode decoder 157 of the sequencer 15A operates the read circuit 13A. As a result, the comparator 153 of the sequencer 15A compares word data read from the flash EEPROM 11B with word data read from the flash EEPROM 11A. Also, in this case, upon receipt of one word data from the serial interface 16B, the serial interface 16A generates an interrupt signal INT to increment the address ADD of the address generator 151 of the sequencer 16A. Therefore, each word data of the flash EEPROM 11B having an address is compared with that of the same address of the flash EEPROM 11A. Further, the flip-flop 156 of the sequencer 15A is operated due to the absence of the write signal W.

When the data of one address of the flash EEPROM 11A is different from the data of the same address of the flash EEPROM 11B, the output signal of the comparator 153 of the sequencer 15A is made "0" (low level), so that the output Q of the flip-flop 156 of the sequencer 15A is made "0" (ERB="0"). Once the output Q of the flip-flop 156 of the sequencer 15B is made "0" (low level), the output Q of the flip-flop 156 of the sequencer 15A is never changed due to the AND circuit 154 disabled by the output Q of the flip-flop 156 of the sequencer 15B.

Next, at step 505, the tester 2' read data of the error signal ERA to determine whether or not the flash EEPROM 11A is normal.

Figure 5:
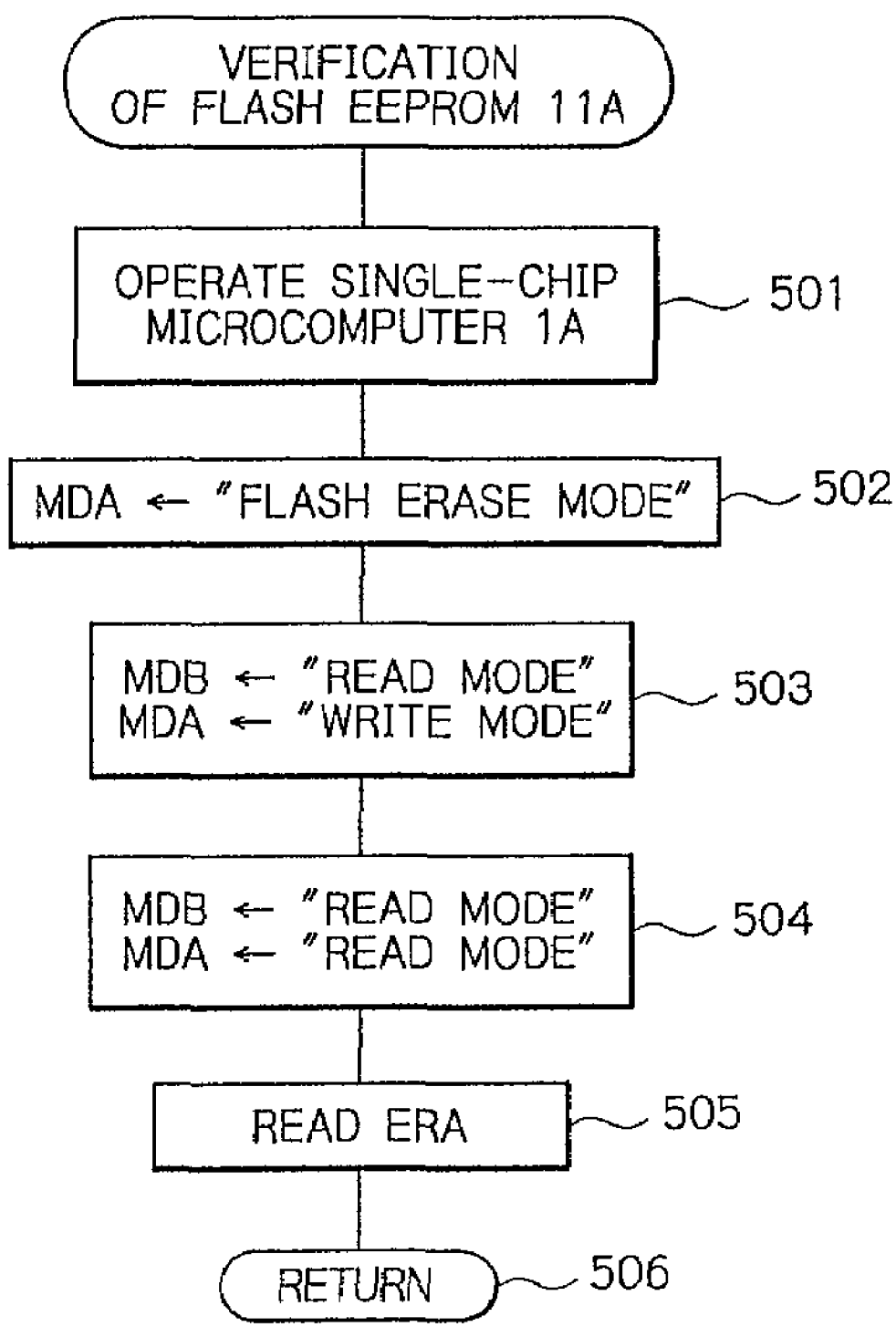
FIG. 5 is a detailed flowchart of verification step 403 of FIG. 4.

Thus, the flowchart of FIG. 5 is completed by step 506.

Step 404 of FIG. 4 will be explained next with reference to FIG. 6.

First, at step 601, the single-chip microcomputer 1B is operated in accordance with the test program stored in the flash EEPROM 11B, thus activating the logic circuit (not shown) of the single-chip microcomputer 1B. This operation is carried out by supplying a special signal to the single-chip microcomputer 1B or the like.

Next, at step 602, the tester 2' causes the mode signal MDB to be "flash erase mode". As a result, the mode decoder 157 of the sequencer 15B operates the erase circuit 14B, so that a flash erase operation is performed upon the flash EEPROM 11B. That is, "0" is written into all the cells of the flash EEPROM 11B.

Next, at step 603, the tester 2' causes the mode signal MDA to be "read mode", and simultaneously, causes the mode signal MDB to be "write mode". As a result, the mode decoder 157 of the sequencer 15A operates the read circuit 13A, and the mode decoder 157 of the sequencer 15B operates the write circuit 12B. As a result, the content of the flash EEPROM 11A is moved via the serial interfaces 16A and 16B to the flash EEPROM 11B. In this case, upon receipt of one word data from the serial interface 16A, the serial interface 16B generates an interrupt signal INT to increment the address ADD of the address generator 151 of the sequencer 16B. Therefore, each word data of the flash EEPROM 11A having an address is written into the same address of the flash EEPROM 11B. Note that the flip-flop 156 of the sequencer 15B is not operated due to the presence of the write signal W.

Next, at step 604, the tester 2' causes the mode signal MDA to be "read mode ", and simultaneously, causes the mode signal MDB to be "read mode". As a result, the mode decoder 157 of the sequencer 15A operates the read circuit 13A, and the mode decoder 157 of the sequencer 15B operates the read circuit 13B. As a result, the comparator 153 of the sequencer 15B compares word data read from the flash EEPROM 11A with word data read from the flash EEPROM 11B. Also, in this case, upon receipt of one word data from the serial interface 16A, the serial interface 16B generates an interrupt signal INT to increment the address ADD of the address generator 151 of the sequencer 16B. Therefore, each word data of the flash EEPROM 11A having an address is compared with that of the same address of the flash EEPROM 11B. Further, the flip-flop 156 of the sequencer 15B is operated due to the absence of the write signal W.

When the data of one address of the flash EEPROM 11A is different from the data of the same address of the flash EEPROM 11B, the output signal of the comparator 153 of the sequencer 15B is made "0" (low level), so that the output Q of the flip-flop 156 of the sequencer 15B is made "0" (ERA="0"). Once the output Q of the flip-flop 156 of the sequencer 15B is made "0" (low level), the output Q of the flip-flop 156 of the sequencer 15B is never changed due to the AND circuit 154 disabled by the output Q of the flip-flop 156 of the sequencer 15B.

Next, at step 605, the tester 2' reads data of the error signal ERB to determine whether or not the flash EEPROM 11B is normal.

Figure 6:
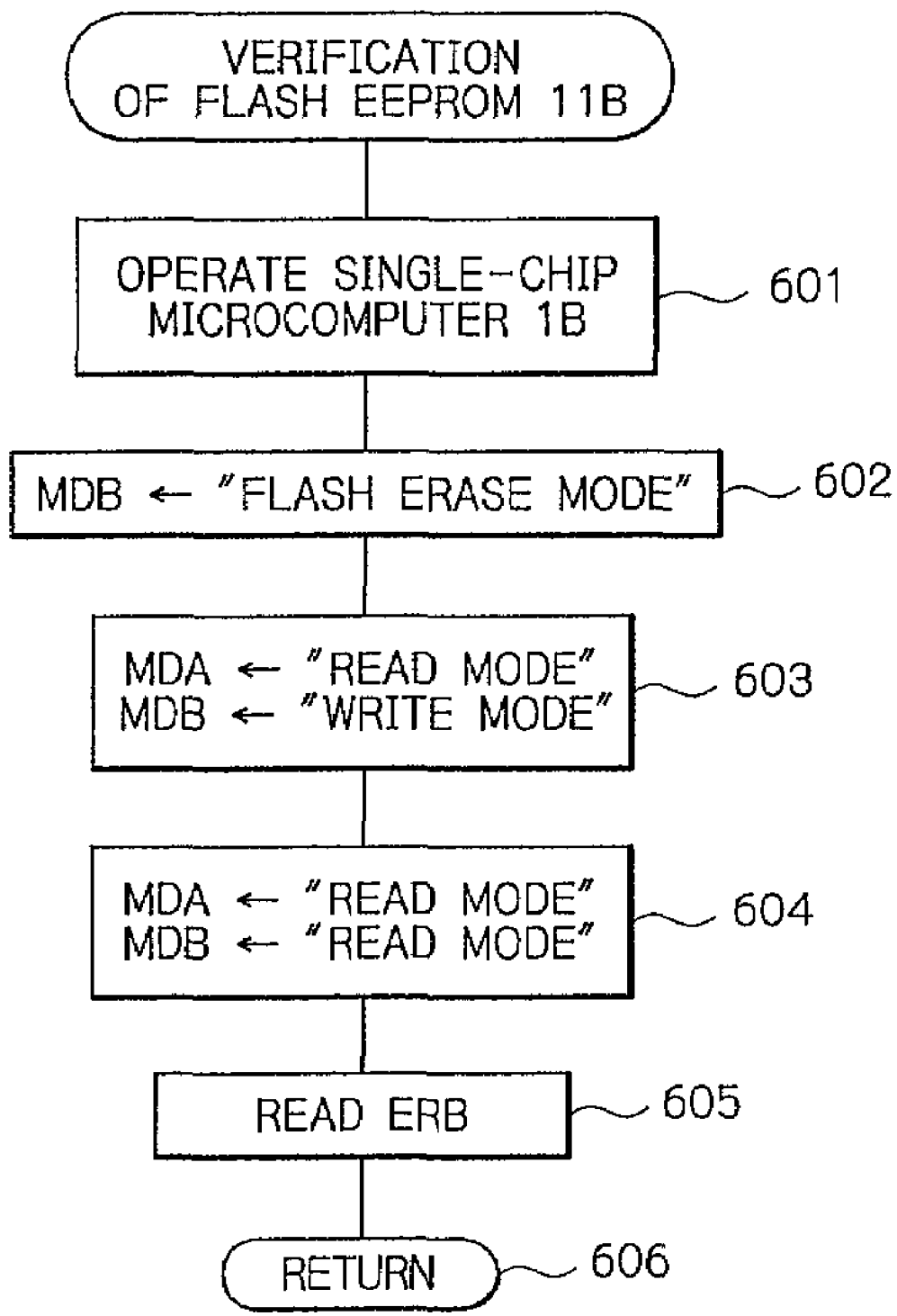
FIG. 6 is a detailed flowchart of verification step 404 of FIG. 4.

Thus, the flowchart of FIG. 6 is completed by step 606.

According to the first embodiment as illustrated in FIGS. 2, 3, 4, 5 and 6, the content of the flash EEPROM 11B or 11A is moved to the flash EEPROM 11A or 11B by the mode signals MDA and MDB generated from the tester 2'. Therefore, since the single-chip microcomputer 1A or 1B can restore the content of the flash EEPROM 11A and 11B to the single-chip microcomputer 1B or 1A, the single-chip microcomputer 1A or 1B can restore the test program even after the flash EEPROM thereof is erased. Thus, the flash EEPROM 11A(11B), the write circuit 12A(12B), the read circuit 13A(13B) and the erase circuit 14A(14B) in addition to the logic circuit can be activated, in other words, all the circuits in the single-chip microcomputer 1A(1B) can be activated. Therefore, in a dynamic burn-in test, stress is equally applied to all the elements of the single-chip microcomputer 1A(1B), thus enhancing the dynamic burn-in test performance.

Additionally, since a function for moving the content of the flash EEPROM of one single-chip microcomputer to the flash EEPROM of the other single-chip microcomputer is provided in the single-chip microcomputers per se, the tester 2' can be simplified.

Note that it was difficult for the LSI tester 2 of FIG. 1 to write burn-in test data from the LSI tester 2 into the flash EEPROM. If the LSI tester 2 forcibly wrote burn-test data into the flash EEPROM, the LSI tester 2 would have been increased in size.

In FIG. 2, only two single-chip microcomputers are connected to the tester 2; however, a large number of single-chip microcomputers, i.e., 1000 single-chip microcomputers can be actually connected to the tester 2', thereby carrying out a plurality of dynamic burn-in test operations simultaneously.

In FIGS. 2 and 3, the sequencer 15A and 15B can be formed by the CPU and firmware. Also, the serial interfaces 16A and 16B can be replaced by parallel interfaces.

Figure 7:
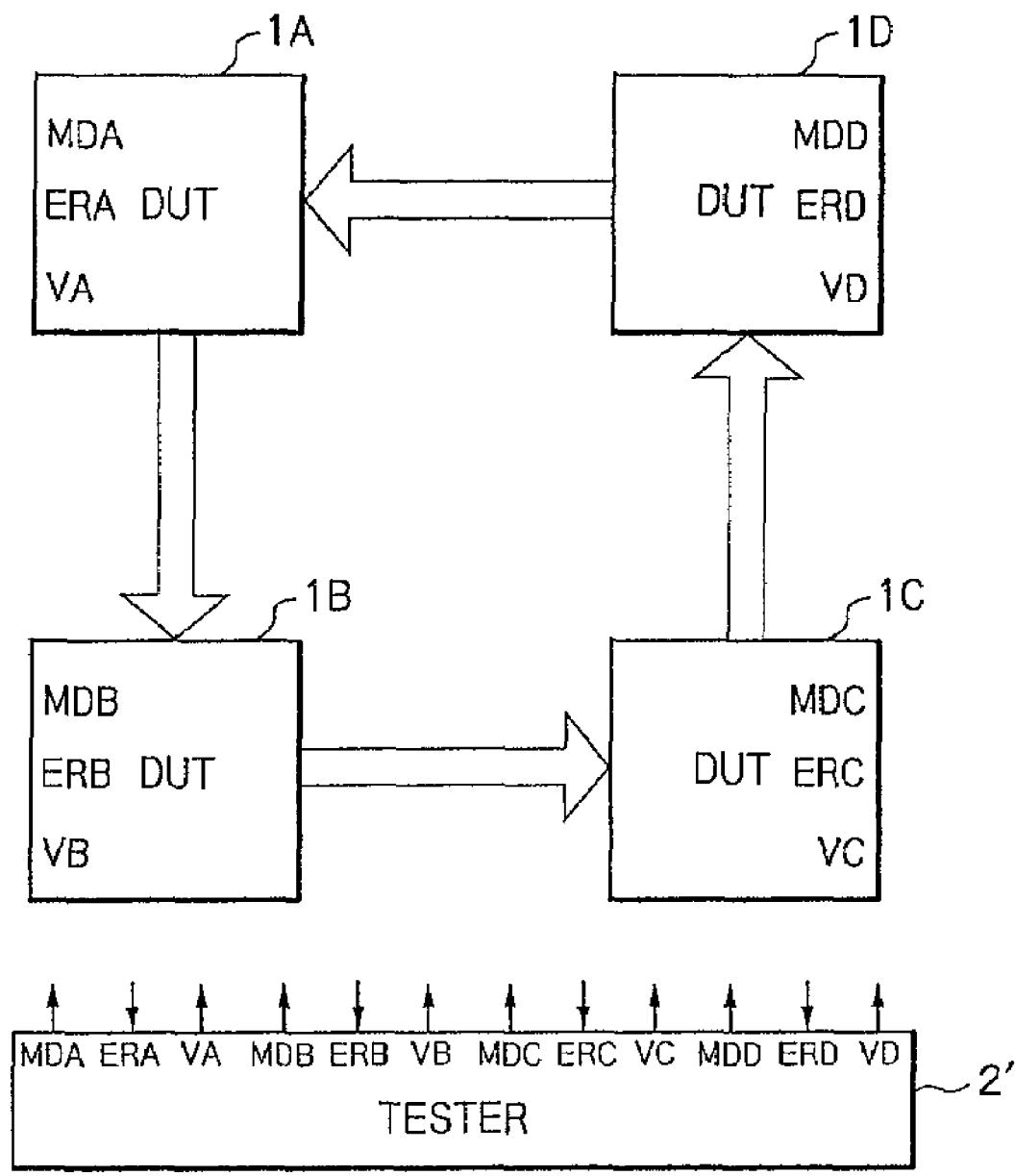
FIG. 7 is a block circuit diagram for explaining a second embodiment of the dynamic burn-in test system according to the present invention.

In FIG. 7, which illustrates a second embodiment of the dynamic burn-in test system according to the present invention, four single-chip microcomputers 1A, 1B, 1C and 1D having the same configuration are under a dynamic burn-in test by a tester 2'. The single-chip microcomputers 1A, 1B, 1C and 1D are connected in a ring shape. That is, an output port of the single-chip microcomputer 1A is connected to an input port of the single-chip microcomputer 1B. Also, an output port of the single-chip microcomputer 1B is connected to an input port of the single-chip microcomputer 1C. Further, an output port of the single-chip microcomputer 1C is connected to an input port of the single-chip microcomputer 1D. Additionally, an output port of the single-chip microcomputer 1D is connected to an input port of the single-chip microcomputer 1A.

In FIG. 7, note that VA, VB, VC and VD designates verification mode signals.

Figure 8:
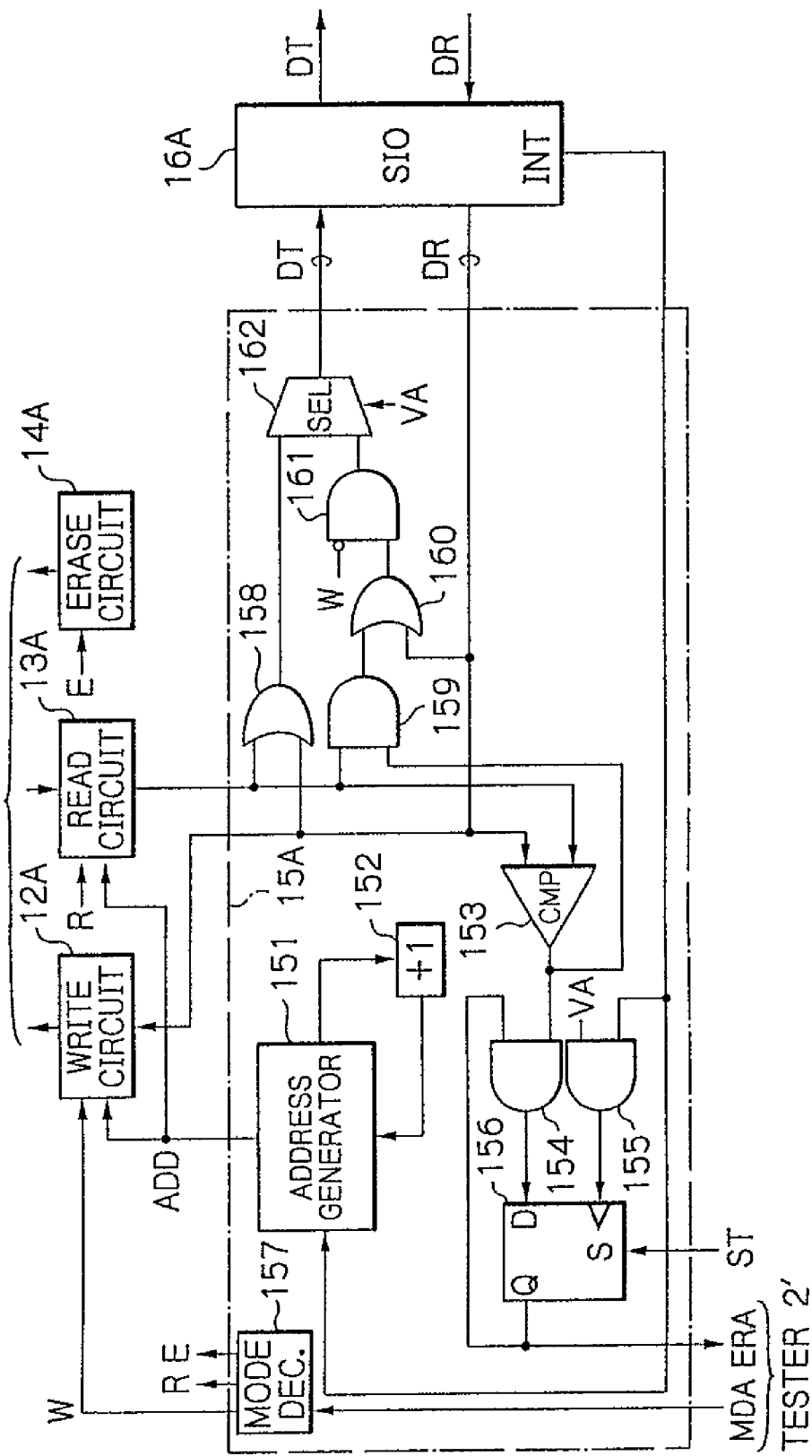
FIG. 8 is a detailed block circuit diagram of the sequencer of FIG. 7.

The single-chip microcomputers 1A, 1B, 1C and 1D has the same configuration as those of FIG. 2 except that an OR circuit 158, an AND circuit 159, an OR circuit 160, an AND circuit 161 and a selector 162 are added to the sequencer 15A as illustrated in FIG. 8. Also, in FIG. 8 the AND circuit 155 is controlled by a verification signal such as VA, not the write signal W.

In the selector 162, in a non-verification mode (VA="0"), the selector 162 selects its upper input, i.e, the OR circuit 158. On the other hand, in a verification mode (VA="1"), the selector 162 selects its lower input. i.e., the AND circuit 159, the OR circuit 160 and the AND circuit 161.

The operation of the dynamic burn-system of FIG. 7 will be explained next with reference to FIG. 9.

The operation of the dynamic burn-in test system of FIG. 7 will be explained next with reference to FIGS. 4, 5 and 9.

First, at step 901, the single-chip microcomputers 1A, 1B, 1C and 1D are initialized. That is, a flash erase operation is performed upon each of the flash EEPROMs by the corresponding erase circuits. Then, the same test program is stored in the EEPROMs.

Next, at step 902, the single-chip microcomputers 1A, 1B, 1C and 1D are mounted on a test board in a high temperature state bath. Note that the test board is electrically connected to the tester 2'. Also, the flip-flop 136 of each of the sequencers is initialized by supplying a set signal ST thereto.

Next, at step 903, a verification is performed upon the flash EEPROM of the single-chip microcomputer 1A. This will be explained later.

Next, at step 904, a verification is performed upon the flash EEPROM of the single-chip microcomputer 1B. This also will be explained later.

Next, at step 905, a verification is performed upon the flash EEPROM of the single-chip microcomputer 1C. This will be explained later.

Next, at step 906, a verification is performed upon the flash EEPROM of the single-chip microcomputer 1D. This will be explained later.

Figure 9:
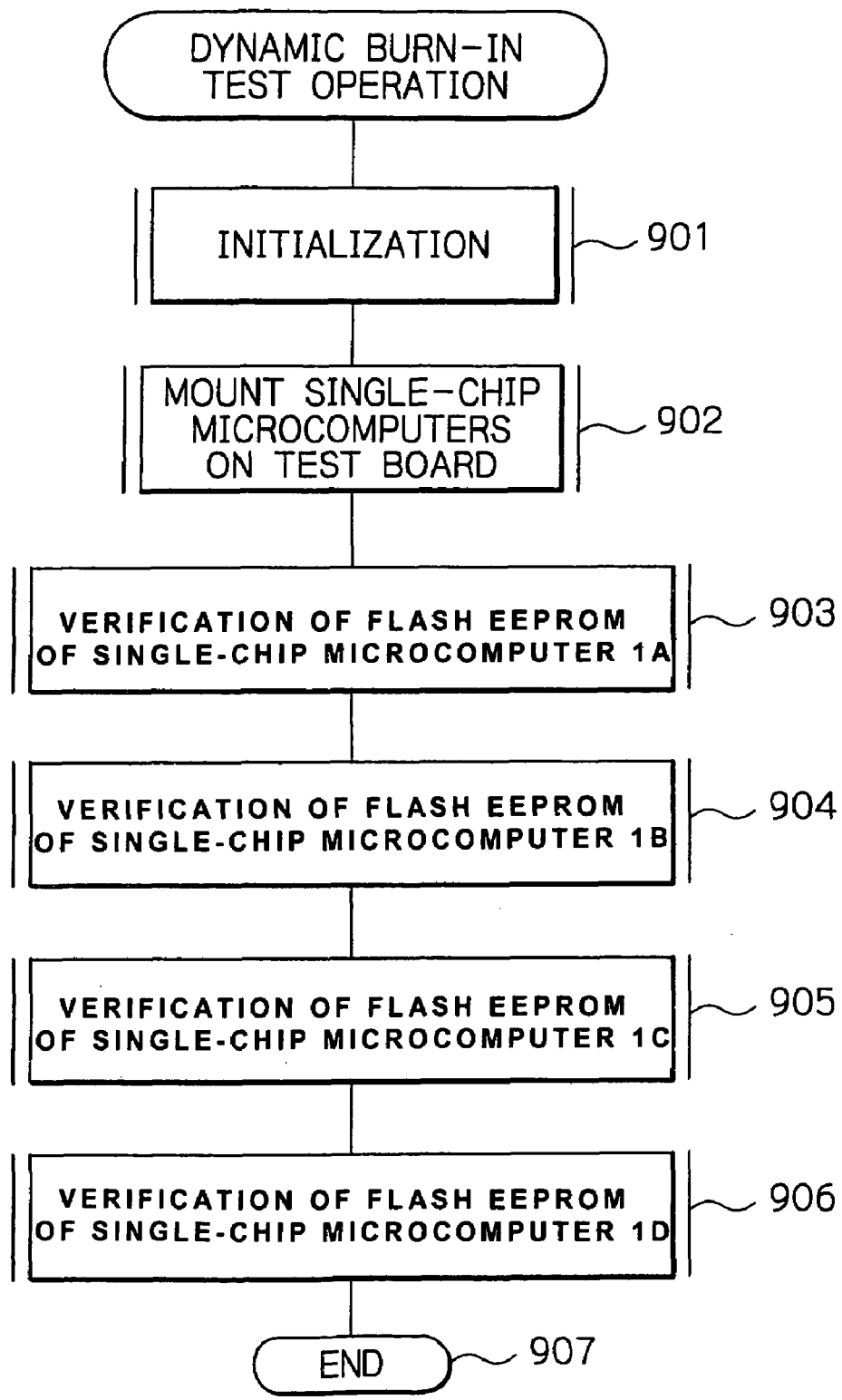
FIG. 9 is a flowchart for explaining the operation of the dynamic burn-in test system of FIG. 7.

Thus, the flowchart of FIG. 9 is completed by step 907.

Figure 10A:
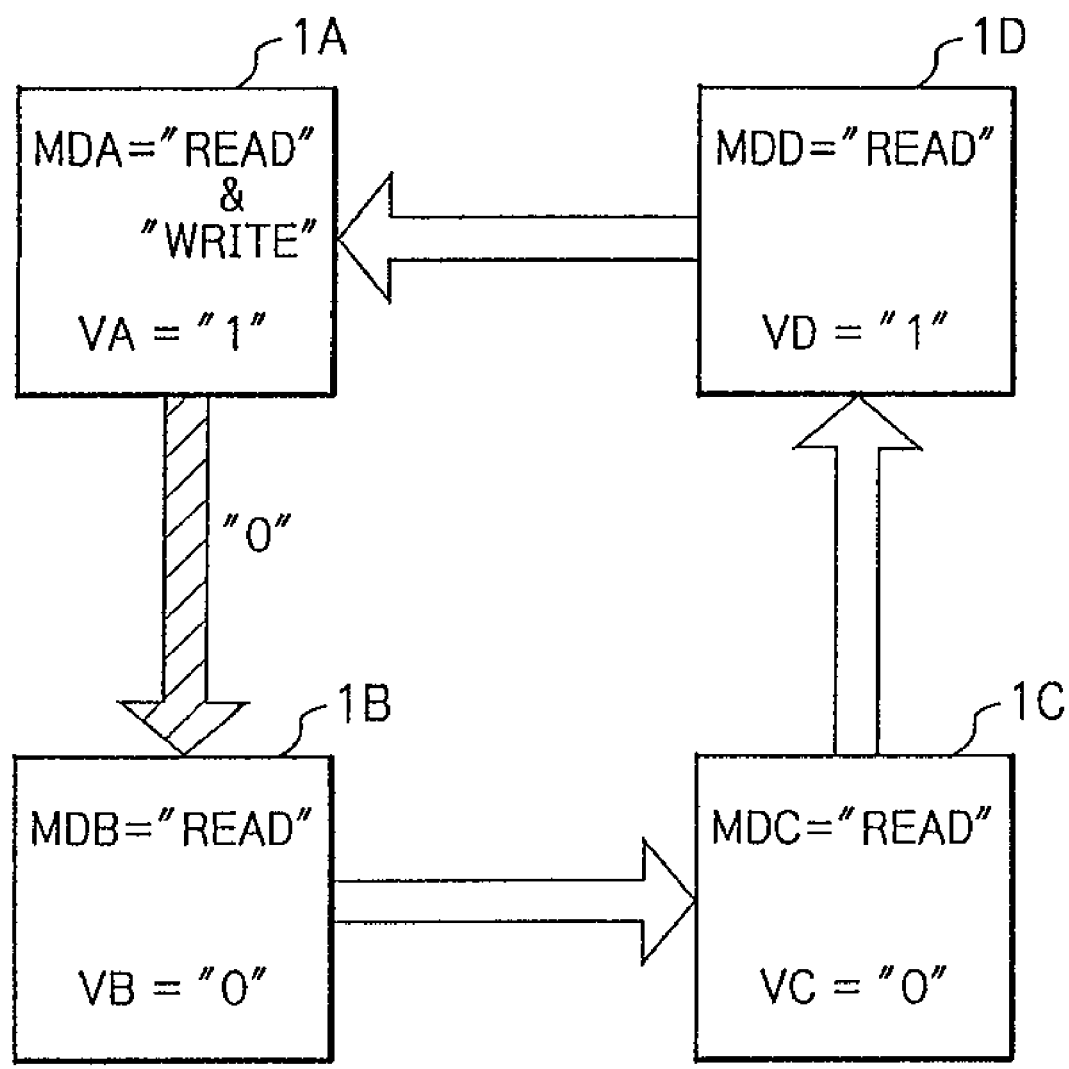
FIGS. 10A, 10B, 10C and 10D are block circuit diagrams for explaining steps 903, 904, 905 and 906, respectively, of FIG. 9.

Step 903 of FIG. 9 will be explained next with reference to FIG. 10A.

That is, in the single-chip microcomputer 1A,
MDA="read mode" and "write mode"
VA="1" (verification mode)
Also, in the single-chip microcomputers 1B and 1C,
MDB=MDC="read mode"
VB=VC="D" (non-verification mode)
Further, in the single-chip microcomputer 1D,
MDD="read mode"
VB="1" (verification mode)

As a result, in the single-chip microcomputer 1A, the comparator 153 compares the data thereof with the output data of the single-chip microcomputer 1D, thus carrying out a verification. Simultaneously, the output data of the single-chip microcomputer 1D is stored in the EEPROM of the single-chip microcomputer 1A. In this case, the selector 162 selects its lower input, and transmits "0" (low level) to the single-chip microcomputer 1B, since the AND circuit 161 is always deactivated by the write signal W.

In the single-chip microcomputer 1B, the selector 162 selects its upper input. Therefore, the OR circuit 158 performs an OR logic operation upon the data of the single-chip microcomputer 1B and the output data of the single-chip microcomputer 1A, so that the result of the OR logic operation is transmitted to the single-chip microcomputer 1C. In this case, since the output data of the single-chip microcomputer 1A is all "0", the output data of the single-chip microcomputer 1B is the same as that of the EEPROM of the single-chip microcomputer 1A.

In the single-chip microcomputer 1C, the selector 162 selects its upper input. Therefore, the OR circuit 158 performs an OR logic operation upon the data of the single-chip microcomputer 1C and the output data of the single-chip microcomputer 1B, so that the result of the OR logic operation is transmitted to the single-chip microcomputer 1D. In this case, if some cells of the EEPROM of the single-chip microcomputer 1B are broken in this dynamic burn-in test, "0" is degenerated in the cells. Even in this case, the output data of the single-chip microcomputer 1C is not affected by the broken cells of the EEPROM of the single-chip microcomputer 1B unless the EEPROM of the single-chip microcomputer 1C is broken. On the contrary, even when the EEPROM of the single-chip microcomputer 1C is broken, the output data of the single-chip microcomputer 1C is not affected by the broken cells of the EEPROM of the single-chip microcomputer 1C unless the EEPROM of the single-chip microcomputer 1B is broken. In other words, unless the EEPROMs of the single-chip microcomputers 1*b* and 1C are both broken, the output data of the single-chip microcomputer 1C is not affected.

In the single-chip microcomputer 1D, the comparator 153 compares the data thereof with the output data of the single-chip microcomputer 1C, thus carrying out a verification. As a result, if the data of the EEPROM of the single-chip microcomputer 1D does not coincide with the output data of the single-chip microcomputer 1C, the output signal of the comparator 153 is made "0", so that the output signal of the AND circuit 159 is made "0". Therefore, since the selector 162 selects its lower input, the output data of the single-chip microcomputer 1C passes through the OR circuit 160 and the AND circuit 161 to the single-chip microcomputer 1A. Note that, as explained above, the error possibility of the output data of the single-chip microcomputer 1C is very low.

Then, the tester 2' reads the error signal ERD to determine whether or not the data of the EEPROM of the single-chip microcomputer 1D is normal. Only when the error signal ERD indicates an error, does the tester 2' cause the mode signal MDD to be "erase mode" to write "0" into all the cells of the EEPROM of the single-chip microcomputer 1D, thus preventing the defects of the single-chip microcomputer 1D from propagating to the other single-chip microcomputer 1A.

Finally, the tester 2' reads the error signal ERA to determine whether or not the EEPROM of the single-chip microcomputer 1A is normal.

Figure 10B:
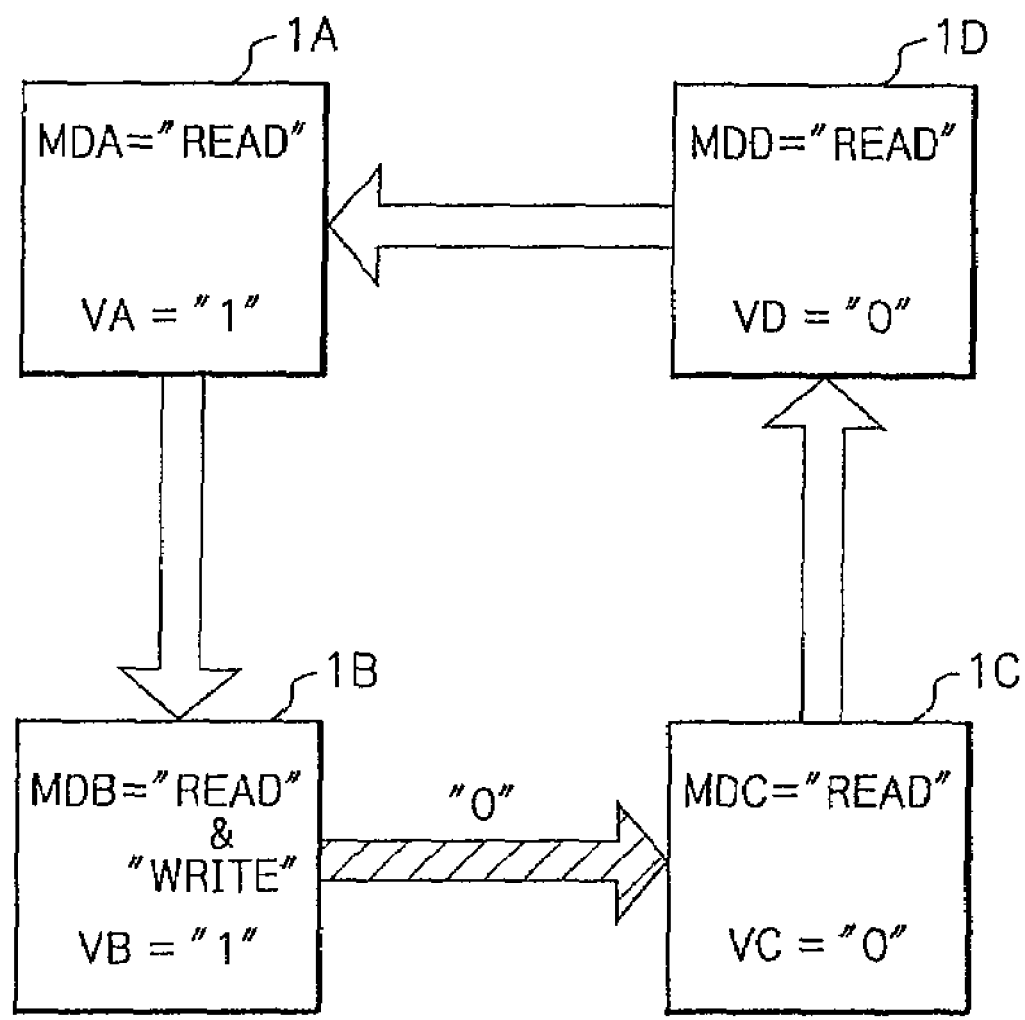

Step 904 of FIG. 9 will be explained next with reference to FIG. 10B. Note that all the flip-flops 156 are set by supplying a set signal ST thereto in advance.

That is, in the single-chip microcomputer 1B,
MDB="read mode" and "write mode"
VB="1" (verification mode)
Also, in the single-chip microcomputers 1C and 1D,
MDC=MDD="read mode"
VC=VD="0" (non-verification mode)
Further, in the single-chip microcomputer 1A,
MDA="read mode"
VA="1" (verification mode)

As a result, in the single-chip microcomputer 1B, as in step 903, the tester 2' reads the error signal ERB to determine whether or not the EEPROM of the single-chip microcomputer 1B is normal.

Figure 10C:
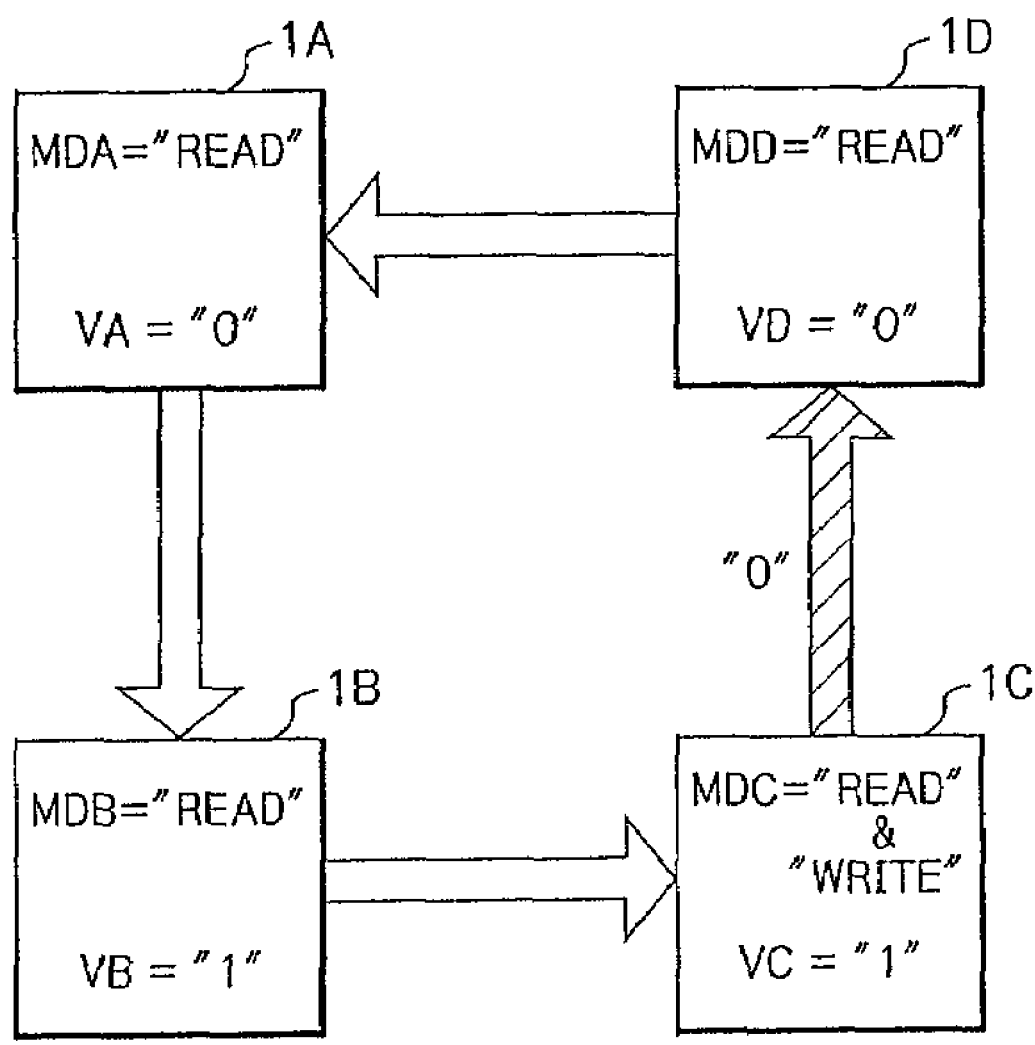

Step 905 of FIG. 9 will be explained next with reference to FIG. 10C. Note that all the flip-flops 156 are set by supplying a set signal ST thereto in advance.

That is, in the single-chip microcomputer 1C,
MDC="read mode" and "write mode"
VC="1" (verification mode)
Also, in the single-chip microcomputers lD and 1A,
MDD=MDA="read mode"
VD=VA="0" (non-verification mode)
Further, in the single-chip microcomputer 1B,
MDB="read mode"
VB="1" (verification mode)

As a result, in the single-chip microcomputer 1C, as in step 903, the tester 2' reads the error signal ERC to determine whether or not the EEPROM of the single-chip microcomputer 1C is normal.

Figure 10D:
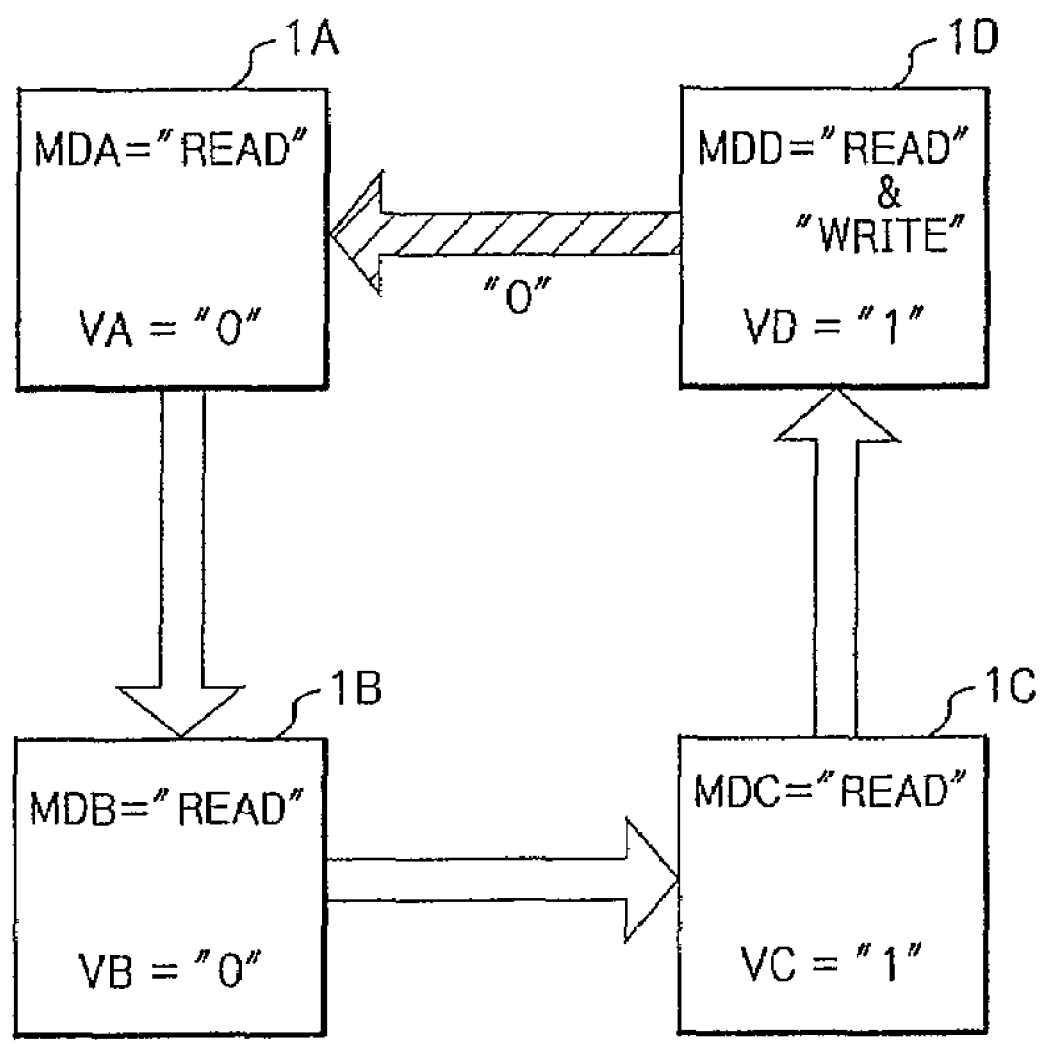

Step 906 of FIG. 9 will be explained next with reference to FIG. 10D. Note that all the flip-flops 156 are set by supplying a set signal ST thereto in advance.

That is, in the single-chip microcomputer 1D,
MDD="read mode" and "write mode"
VD="1" (verification mode)
Also, in the single-chip microcomputers 1A and 1B, MDA=MDB="read mode"
VA=VB="0" (non-verification mode)
Further, in the single-chip microcomputer 1C,
MDC="read mode"
VC="1" (verification mode)

As a result, in the single-chip microcomputer 1D, as in step 903, the tester 2' reads the error signal ERD to determine whether or not the EEPROM of the single-chip microcomputer 1D is normal.

In the second embodiment as illustrated in FIGS. 9, 10A, 10B, 10C and 10D, even if one of the single-chip microcomputers 1A, 1B, 1C and 1D is broken under a dynamic burn-in test, the other single-chip microcomputers can be under dynamic burn-in test, thus determining whether or not the EEPROMs of the other single-chip microcomputers are normal.

In the second embodiment, although the number of single-chip microcomputers connected in a ring shape is 4, the number of single-chip microcomputers can be 3 or more than 4.

As explained hereinabove, according to the present invention, since a tester neither needs to supply test programs to the nonvolatile semiconductor memory device of each single-chip microcomputer, nor to directly control the nonvolatile semiconductor memory device of each single-chip microcomputer, the nonvolatile semiconductor memory device of each single-chip microcomputer can be decreased in size, and the dynamic burn-in screening effect can be enhanced while simplifying the tester.

The invention claimed is:

1. A single-chip microcomputer comprising:
    a nonvolatile semiconductor memory device;
    write, read and erase circuits, connected to said nonvolatile semiconductor memory device, for performing a write operation, a read operation and an erase operation upon said nonvolatile semiconductor memory device, respectively;
    an interface;
    a sequencer, connected between said write, read and erase circuits and said interface, for receiving first data via said interface from another single-chip microcomputer under testing to write said first data into said nonvolatile semiconductor memory device, reading said first data from said nonvolatile semiconductor memory device to compare said first data with second data read via said interface from said another single-chip microcomputer thus performing a verification upon said nonvolatile semiconductor memory device, and reading third data from said nonvolatile semiconductor memory device and transmitting said third data via said interface to said another single-chip microcomputer.

2. The single-chip microcomputer as set forth in claim 1, wherein a test program is written into said nonvolatile semiconductor memory device to operate said single-chip microcomputer using said test program,
    said sequencer making said erase circuit perform a flash erase operation upon said nonvolatile semiconductor memory device, after said single-chip microcomputer is operated and before said first data is written into said nonvolatile semiconductor memory device.

3. The single-chip microcomputer as set forth in claim 1, wherein said sequencer comprises:
    an address generator, connected between said interface and said write and read circuit, for receiving an interrupt signal from said interface to generate an address and transmit said address to said write and read circuits; and
    an error detection circuit, connected to said read circuit and said interface, for comparing said first data with said second data to generate an error signal when said first data does not coincide with said second data.

4. The single-chip microcomputer as set forth in claim 1, wherein said sequencer comprises a mode decoder, connected to said write, read and erase circuits, for receiving a mode signal from said another single-chip microcomputer to operate said write, read and erase circuits.

5. The single-chip microcomputer as set forth in claim 1, wherein said sequencer comprises an OR circuit, connected to said read circuit and said interface, for performing an OR logic operation upon said first data read from said read circuit and said second data read from said interface to transmit a result of said OR logic operation via said interface to said another single-chip microcomputer.

6. The single-chip microcomputer as set forth in claim 1, wherein said sequencer comprises a logic circuit, connected to said write circuit, for generating a "0" logic signal to transmit said "0" logic signal via said interface to said another single-computer microcomputer, when said write and read circuits are operated.

7. The single-chip microcomputer as set forth in claim 3, wherein said sequencer comprises a logic circuit, connected to said read circuit, said error detection circuit and said interface, for performing a first OR logic operation upon said first data read from said read circuit and said second data read from said interface to transmit a result of said first OR logic operation via said interface to said another single-chip microcomputer when said error signal is not generated and for performing a second OR logic operation upon a "0" logic signal and said second data read from said interface to transmit a result of said second OR logic operation to said another single-chip microcomputer when said error signal is generated,
    said sequencer making said erase circuit perform a flash erase operation upon said semiconductor memory device after said error signal is generated.

8. A single-chip microcomputer comprising:
    a nonvolatile semiconductor memory device;
    write, read and erase circuits, connected to said nonvolatile semiconductor memory device, for performing a write operation, a read operation and an erase operation upon said nonvolatile semiconductor memory device, respectively;
    an interface;
    a sequencer means for receiving first data via said interface from another single-chip microcomputer under testing to write said first data into said nonvolatile semiconductor memory device, reading said first data from said nonvolatile semiconductor device to compare said first data with second data read via said interface from said another single-chip microcomputer thus performing a verification upon said nonvolatile semiconductor memory device, and reading third data from said nonvolatile semiconductor memory device and transmitting said third data via said interface to said another single-chip microcomputer.

9. The single-chip microcomputer as set forth in claim 8, wherein a test program is written into said nonvolatile semiconductor memory device to operate said single-chip microcomputer using said test program,
    said sequencer means making said erase circuit perform a flash erase operation upon said nonvolatile semiconductor memory device, after said single-chip microcomputer is operated and before said first data is written into said nonvolatile semiconductor memory device.

10. The single-chip microcomputer as set forth in claim 8, wherein said sequencer means comprises:
an address generating means, for receiving an interrupt signal from said interface to generate an address and transmit said address to said write and read circuits; and
an error detection means for comparing said first data with said second data to generate an error signal when said first data does not coincide with said second data.

11. The single-chip microcomputer as set forth in claim 8, wherein said sequencer means comprises a mode decoding means for receiving a mode signal from said another single-chip microcomputer to operate said write, read and erase circuits.

12. The single-chip microcomputer as set forth in claim 8, wherein said sequencer means comprises an OR logic means for performing an OR logic operation upon said first data read from said read circuit and said second data read from said interface to transmit a result of said OR logic operation via said interface to said another single-chip microcomputer.

13. The single-chip microcomputer as set forth in claim 8, wherein said sequencer means comprises a logic means for generating a "0" logic signal to transmit said "0" logic signal via said interface to said another single-chip microcomputer, when said write and read circuits are operated.

14. The single-chip microcomputer as set forth in claim 10, wherein said sequencer means comprises a logic means for performing a first OR logic operation upon said first data read from said read circuit and said second data read from said interface to transmit a result of said first OR logic operation via said interface to said another single-chip microcomputer when said error signal is not generated and for performing a second OR logic operation upon a "0" logic signal and said second data read from said interface to transmit a result of said second OR logic operation to said another single-chip microcomputer,
said sequencer means making said erase circuit performing a flash erase operation upon said semiconductor memory device after said error signal is generated.

15. A dynamic burn-in test method for two single-chip microcomputers each including a nonvolatile semiconductor memory device, comprising the steps of:
writing a test program into the nonvolatile semiconductor memory devices of said single-chip microcomputers to operate said single-chip microcomputers using said test program;
performing a flash erase operation upon the nonvolatile semiconductor memory device of one of said single-chip microcomputers, after said single-chip microcomputers are operated;
moving a first content of the nonvolatile semiconductor memory device of the other of said single-chip microcomputers to the nonvolatile semiconductor memory device of the one of said single-chip microcomputers, after the nonvolatile semiconductor memory device of the one of said single-chip microcomputers is erased; and
comparing the first content of the nonvolatile semiconductor memory device of the one of said single-chip microcomputers with a second content of the nonvolatile semiconductor memory device of the other of said single-chip microcomputers, thus carrying out a verification of the nonvolatile semiconductor memory device of the one of said single-chip microcomputers.

16. A dynamic burn-in test method for at least first, second and third single-chip microcomputers connected in a ring shape, each including a nonvolatile semiconductor memory device, comprising the steps of:
writing a test program into the nonvolatile semiconductor memory devices of said first, second and third single-chip microcomputers to operate said first, second and third single-chip microcomputers using said test program;
performing a flash erase operation upon the nonvolatile semiconductor memory device of said first single-chip microcomputer, after said first, second and third single-chip microcomputers are operated;
operating said first single-chip microcomputer to receive data from said third single-chip microcomputer, compare the data from said third single-chip microcomputer with data of the nonvolatile semiconductor memory device of said first single-chip microcomputer, and transmit "0" data to said second single-chip microcomputer;
operating said second single-chip microcomputer to receive the data from said first single-chip microcomputer, perform an OR logic operation upon the data from said first single-chip microcomputer and data of the nonvolatile semiconductor memory device of said second single-chip microcomputer, and transmit result data of said OR logic operation to said third single-chip microcomputer; and
operating said third single-chip microcomputer to receive the data from said second single-chip microcomputer, perform an OR logic operation upon the data from said second single-chip microcomputer and data of the nonvolatile semiconductor memory device of said third single-chip microcomputer, transmit result data of said OR logic operation to said first single-chip microcomputer when the data from said second single-chip microcomputer coincides with the data of the nonvolatile semiconductor memory device of said third single-chip microcomputer, and transmit the data from said second single-chip microcomputer to said first single-chip microcomputer when the data from said second single-chip microcomputer does not coincide with the data of the nonvolatile semiconductor memory device of said third single-chip microcomputer.

17. The method as set forth in claim 16, further comprising performing an erase operation upon the nonvolatile semiconductor memory device of said third single-chip microcomputer when the data from said second single-chip microcomputer does not coincide with the data of the nonvolatile semiconductor memory device of said third single-chip microcomputer.

* * * * *